(12) United States Patent
Yokoyama

(10) Patent No.: US 6,930,544 B2
(45) Date of Patent: Aug. 16, 2005

(54) FILTER

(75) Inventor: Akio Yokoyama, Ibaraki (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/754,569

(22) Filed: Jan. 12, 2004

(65) Prior Publication Data

US 2004/0174208 A1 Sep. 9, 2004

(30) Foreign Application Priority Data

Mar. 7, 2003 (JP) .................................. 2003-061418

(51) Int. Cl.[7] .............................................. H03K 5/00
(52) U.S. Cl. ...................... 327/552; 327/556; 327/557
(58) Field of Search ................................ 327/552–559

(56) References Cited

U.S. PATENT DOCUMENTS

| | | | | |
|---|---|---|---|---|
| 5,235,540 A | * | 8/1993 | DeVeirman | 708/819 |
| 5,258,716 A | * | 11/1993 | Kondo et al. | 330/85 |
| 5,317,217 A | * | 5/1994 | Rieger et al. | 327/555 |
| 6,157,248 A | * | 12/2000 | Minami et al. | 327/552 |

OTHER PUBLICATIONS

Y. Tsividis, "Integrated Continuous–Time Filter Design—An Overview", IEEE Journal of Solid–State Circuits, vol. 29, No. 3, Mar. 1994, pp. 166–176.

* cited by examiner

*Primary Examiner*—Dinh T. Le
(74) *Attorney, Agent, or Firm*—Stevens, Davis, Miller & Mosher, LLP

(57) ABSTRACT

The object of the present invention is to obtain a high precision notch filter or all-pass filter. Therefore, two transconductance circuits for adjustment, which perform a voltage-current conversion of a difference between a voltage of a filter input terminal and a voltage of a filter output terminal, are added to two integrators comprising two transconductance circuits for the integrators, and two capacitors. An output current of one transconductance circuit for adjustment is added to an output current of the transconductance circuit for the integrators, and an output current of the other transconductance circuit for adjustment is subtracted from an output current of the transconductance circuit for the integrators. Therefore, by adjusting conductance values of the two transconductance circuits for adjustment, even when non-ideal characteristics would exist in the transconductance circuits for the integrators, those can be canceled.

12 Claims, 11 Drawing Sheets

FILTER

BACKGROUND OF THE INVENTION

1. Field of the Invention

The present invention relates to a high precision filter used in a communication field or the like. In particular, it relates to a notch filter which can control an attenuation.

2. Prior Art

FIG. 4 is a block diagram showing one example of a notch filter circuit which is used in a prior art, and shows a biquad-type second order notch filter configuration. In FIG. 4, reference numeral 1 represents an input terminal to which an input voltage Vin is inputted. Reference numerals 2 and 3 represent transconductance circuits which have transconductance values gm1 and gm2, respectively. Reference numerals 8 and 9 represent voltage buffer circuits, respectively. Reference numerals 6 and 7 represent capacitors which have capacitance values C1 and C2, respectively. Reference numeral 12 represents a ground terminal. Reference numeral 10 represents a filter output terminal from which an output voltage Vo is outputted.

The biquad filter circuit configures a notch filter. In the notch filter, supposing that transconductance values of the transconductance circuits 2 and 3 are gm1 and gm2, respectively, a transfer function H (s), which is defined as an output voltage/an input voltage, is given as follows. Where, $s=j\omega$.

$$H(s) = Vo/Vin \qquad (1)$$
$$= (s^2 + gm1 \cdot gm2/(C1 \cdot C2))/$$
$$(s^2 + s \cdot (gm2/C2) + gm1 \cdot gm2/(C1 \cdot C2))$$

Here, one example of a specific circuit configuration of the transconductance circuit 2 is shown in FIG. 10. The transconductance circuit 3 has a similar circuit configuration, and a transconductance circuit which is added in a below-mentioned embodiment (refer to FIG. 1) also has a similar circuit configuration. In FIG. 10, reference numeral 2A represents a positive polarity input terminal, reference numeral 2B represents a negative polarity input terminal, reference numeral 2C represents an output terminal, reference numerals M1, M2, and M3 represent MOS transistors, respectively, and reference numerals IA1 and IA2 represent current sources, respectively. Reference numeral Vdd represents a supply voltage (reference voltage) applied to the transconductance circuit, and reference numeral Vc represents a control voltage applied to the transconductance circuit.

The MOS transistors M1, M2, and M3 configure the transconductance. Supposing that a current which flows through the MOS transistor M3 is 2Io and a gain constant is β, the transconductance value gm1 is expressed as follows.

$$gm1=(\beta Io/2)^{1/2}$$

Where, the gain constant β is represented as follows.

$$\beta=\mu Cox(W/L)$$

Here, a symbol $\mu$ represents mobility, a symbol Cox represents a gate oxide capacitance, a symbol W represents a gate width, and a symbol L represents a gate length.

Accordingly, a value of the transconductance value gm1 can be controlled by controlling the gate voltage Vc of the MOS transistor M3.

FIG. 6 is a block diagram showing another example of a second order notch filter of the prior art. In FIG. 6, reference numeral 1A represents a positive phase filter input terminal to which an input voltage Vin/2 is inputted, and reference numeral 1B represents a negative phase filter input terminal to which an input voltage −Vin/2 is inputted. Reference numerals 20, 30, 13, and 14 represent full differential transconductance circuits that have transconductance values gm1, gm2, gm5, and gm6, respectively. Reference numerals 60, 71, and 72 represent capacitors which have capacitance values C1, C21, and C22, respectively. Reference numerals 10A and 10B represent a positive phase filter output terminal and a negative phase filter output terminal from which an output voltage Vo is outputted, respectively.

Then, a filter output is derived from between the positive phase filter output terminal 10A and the negative phase filter output terminal 10B, and a notch filter of a full differential type is configured.

Supposing that the transconductance values of the full differential transconductance circuits 20, 30, 13 and 14 are gm1, gm2, gm5, and gm6, respectively, the capacitance values of the capacitors 71 and 72 are C21 and C22, respectively, and C21=C22=2C2, a transfer function H (s) between the positive phase filter output terminal 10A and the negative phase filter output terminal 10B defined as the output voltage/the input voltage is given as follows. Where, $s=j\omega$.

$$H(s) = Vo/Vin \qquad (2)$$
$$= (s^2 + gm1 \cdot gm6/(C1 \cdot C2))/$$
$$(s^2 + s \cdot (gm2/C2) + gm5 \cdot gm6/(C1 \cdot C2))$$

Here, one example of a specific circuit configuration of the transconductance circuit 20 is shown in FIG. 11. The transconductance circuits 30, 13, and 14 have a similar configuration, and a transconductance circuit which is added in a below-mentioned embodiment (refer to FIG. 2 and FIG. 3) also has a similar configuration. In FIG. 11, reference numeral 20A represents a positive polarity input terminal, reference numeral 20B represents a negative polarity input terminal, reference numeral 20C represents a positive polarity output terminal, and reference numeral 20D represents a negative polarity output terminal. Reference numerals M11, M12, and M13 represent MOS transistors, respectively. Reference numerals IB1 and IB2 represent current sources, respectively. Reference numeral Vdd represents a supply voltage (reference voltage) applied to the transconductance circuit, and reference numeral Vc represents a control voltage applied to the transconductance circuit.

MOS transistors M11, M12, and M13 configure the transconductance. Supposing that a current which flows through the MOS transistor M13 is 2Io and a gain constant is β, the transconductance value gm1 is expressed as follows.

$$gm1=(\beta Io/2)^{1/2}$$

Where, the gain constant β is represented as follows.

$$\beta=\mu Cox(W/L)$$

Here, a symbol $\mu$ represents mobility, a symbol Cox represents a gate oxide capacitance, a symbol W represents a gate width, and a symbol L represents a gate length.

Accordingly, the value of transconductance value gm1 can be controlled by controlling the gate voltage Vc of the MOS transistor M13.

FIG. 8 is a block diagram showing one example of a second order all-pass filter of the prior art. In FIG. 8, reference numeral 17 represents an operational amplifier and the operational amplifier 17 configures an inverting amplifier. Reference numerals 15 and 16 represent resistors which have resistance values R2 and R2', respectively. Reference numerals 600 and 700 represent capacitors which have capacitance values C1 and C2, respectively. Reference numeral 12 represents a ground terminal, reference numeral 1C represents a signal input terminal to which an input voltage Vin is inputted, and reference numeral 10C represents a signal output terminal from which an output voltage Vo is outputted. Reference numerals 200 and 300 represent transconductance circuits, which are amplifiers having transconductance values gm1 and gm2, respectively. Reference numerals 80 and 90 represent voltage buffer circuits, respectively.

Supposing that transconductance values of each of the transconductance circuits 200 and 300 are gm1 and gm2, respectively, the output of the operational amplifier 17 of the filter circuit shows all-pass filter characteristics. A transfer function H (s) of the operational amplifier 17, which is defined as an output voltage/an input voltage thereof is given as follows. Where, s=jω and R2=R2'.

$$H(s) = Vo/Vin \quad (3)$$

$$= -(s^2 - s \cdot gm2/C2 + (gm1 \cdot gm2/(C1 \cdot C2)))/$$

$$(s^2 + s(gm2/C2) + gm1 \cdot gm2/(C1 \cdot C2))$$

As for an active filter which has used the operational amplifier, and a filter which has used the transconductance circuit, deviation from target characteristics has often occurred. The cause is that the amplifier or the transconductance circuit generally has a finite gain or finite frequency characteristics; namely, there exists the deviation from the ideal characteristics. In particular, in a steep filter having high selectivity, or a notch filter having a large attenuation, the deviation has become larger, and that has made it difficult to realize the characteristics.

A notch filter, in which a finite parasitic output resistor 11 is added to the transconductance circuit 2, is shown in FIG. 5. Supposing that a resistance value of the output resistor 11 of the transconductance circuit 2 is RL and others are similar to those of FIG. 4, a transfer function H(s) of the notch filter is given as follows.

$$H(s) = Vo/Vin \quad (4)$$

$$= (s^2 + s/(C1 \cdot RL) + gm1 \cdot gm2/(C1 \cdot C2))/$$

$$(s^2 + s \cdot (1/(C1 \cdot RL) + gm2/C2) +$$

$$(gm1 + 1/RL) \cdot gm2/(C1 \cdot C2))$$

As can be seen from equation (4), a primary term is left in a numerator of the transfer function H (s).

Here, when the resistance value RL is infinite, it becomes the same value as equation (1), but generally, since the resistance value RL is finite, the depth of the notch is not a infinite value but a finite value. In addition, a characteristic frequency or selectivity also deviates from ideal characteristics. The resistor 11 which has the resistance value RL is a phase advance element to the integrator.

In addition, supposing that the resistance value RL is infinite, approximating that only the frequency characteristics of the transconductance value gm1 is that of a primary low pass filter, and defining that a transfer function thereof is G(s)=ωa/(s+ωa), the transfer function of the notch filter H (s) can be approximated as follows.

$$H(s) = Vo/Vin \quad (5)$$

$$= (s^2 - s(gm1 \cdot gm2/(C1 \cdot C2 \cdot \omega a) + gm1 \cdot gm2/(C1 \cdot C2))/$$

$$(s^2 + s \cdot (gm2/(C2 - gm1 \cdot gm2/(C1 \cdot C2 \cdot \omega a)) +$$

$$(gm1 \cdot gm2/(C1 \cdot C2))$$

Accordingly, similar to equation (4), the primary term is left in the numerator of the transfer function H (s), and the attenuation does not become infinite unless the angular frequency ωa is infinite.

An example of the characteristics of the integrator which consists of the conductance gm1, the capacitance C1, and the resistance RL is shown in FIG. 7. In FIG. 7, a gain and a phase substantially begin to change from a first pole which is determined by the capacitance C1 and the resistance RL, and begin to change once again at a second pole which is determined by the frequency characteristics of the transconductance circuit. Accordingly, depending on which frequency on the characteristics of the integrator is used, it is used as a phase lag or phase advance integrator. Incidentally, a turning point of the gain is a turning point of the pole, and the phase changes from 0 to −90 degrees at the first pole.

Ideally, although the phase of the integrator should not be based on the frequency but must be constant at −90 degrees, in the frequency $f_A$ shown in the example of FIG. 7, it will be used in a state of a slight phase lag, thereby the filter characteristics deviate from the target.

One countermeasure implemented to this is inserting a resistance r in series with the capacitance C1 to perform a phase compensation similar to the phase compensation of the operational amplifier or the like as described by Yannis P. Tsividis, "Integrated Continuous-Time Filter Design-An Overview" IEEE Journal of Solid-State Circuits, Vol. 29, No3, March 1994, PP 166–173.

Generally, the value of the resistance r is chosen near ωa=1/(C1·r).

However, when the transconductance circuit which comprises of a transistor is compensated by a pure resistance, a problem that it is weak against variations in elements arises, and it cannot be used for a phase advance element.

For this reason, it has been difficult to deliver sufficient characteristics in a notch filter particularly sensitive to the change in phase. In addition, similarly, an all-pass filter has had a constant gain and has been intended to use the only change in phase, a similar problem has been existed.

A characteristics chart, such as a notch filter, is shown in FIG. 9. In FIG. 9, by a non-ideal effect of the transconductance circuit or the operational amplifier, originally, in FIG. 9, even when characteristics as shown in reference numeral (a) have been a target, as shown in reference numeral (b) in the same figure, it may become notch characteristics having insufficient attenuation. In addition, even when the all-pass filter which has characteristics as shown in reference numeral (c) of the same figure is a target, it may become a filter which has characteristics as shown in reference numeral (b) or reference numeral (d) of the same figure by the non-ideal effect of the transconductance circuit or the operational amplifier.

SUMMARY OF THE INVENTION

The object of the present invention is, for example, for a notch filter or an all-pass filter, to solve the above problems, and to provide a filter which is easy to realize an accuracy and strong against variations in elements.

In addition, another object of the present invention is to provide a notch filter which can realize a sufficiently large attenuation.

In addition, another object of the present invention is to provide an all-pass filter with high accuracy.

A filter according to a first invention comprises of a first and a second integrators. The first integrator includes a first transconductance circuit (2) which performs a voltage-current conversion of a difference between a voltage of a filter input terminal (1) and a voltage of a filter output terminal (10), and a first capacitor (6).

The second integrator includes a second transconductance circuit (3) which performs a voltage-current conversion of a difference between an output voltage of the first integrator and a voltage of the filter output terminal (10), a third transconductance circuit (4) which performs a voltage-current conversion of a difference between the voltage of the filter input terminal (1) and the voltage of the filter output terminal (10) wherein an output current thereof is added to an output current of the second transconductance circuit (3), and a second capacitor (7).

Then, it is configured so that an output voltage of the second integrator and the voltage of the filter input terminal (1) may be added. An output terminal of the second transconductance circuit (3) becomes the filter output terminal (10).

According to this configuration, the third transconductance circuit which performs the voltage-current conversion of the difference between the voltage of the filter input terminal and the voltage of the filter output terminal is arranged so that the output current of the third transconductance circuit is added to the output current of the second transconductance circuit. Therefore, by adjusting the third transconductance circuit, even when non-ideal characteristics would exist in the first or the second transconductance circuit, those can be canceled, and thereby desired characteristics of the filter, such as a notch filter, an all-pass filter, a bell filter, a dip filter or the like, can be obtained with high accuracy, and a filter which is strong against variations in elements can be obtained. In particular, even when the non-ideal characteristics would exist in the first or the second transconductance circuit, those can be cancelled, and thereby a sufficient attenuation of the notch filter can be obtained.

A filter according to a second invention comprises of a first and a second integrators. The first integrator includes a first transconductance circuit (2) which performs a voltage-current conversion of a difference between a voltage of a filter input terminal (1) and a voltage of a filter output terminal (10), and a first capacitor (6).

The second integrator includes a second transconductance circuit (3) which performs a voltage-current conversion of a difference between an output voltage of the first integrator and a voltage of the filter output terminal (10), a third transconductance circuit (5) which performs a voltage-current conversion of a difference between the voltage of the filter input terminal (1) and the voltage of the filter output terminal (10) wherein an output current thereof is subtracted from an output current of the second transconductance circuit (3), and a second capacitor (7).

Then, it is configured so that an output voltage of the second integrator and the voltage of the filter input terminal (1) may be added. An output terminal of the second transconductance circuit (3) becomes the filter output terminal (10).

According to this configuration, the third transconductance circuit which performs the voltage-current conversion of the difference between the voltage of the filter input terminal and the voltage of the filter output terminal is arranged so that the output current of the third transconductance circuit is subtracted from the output current of the second transconductance circuit. Therefore, by adjusting the third transconductance circuit, even when non-ideal characteristics would exist in the first or the second transconductance circuit, those can be canceled, and thereby desired characteristics of the filter, such as a notch filter, an all-pass filter, a bell filter, a dip filter or the like, can be obtained with high accuracy, and a filter which is strong against variations in elements can be obtained. In particular, even when the non-ideal characteristics would exist in the first or the second transconductance circuit, those can be cancelled, and thereby a sufficient attenuation of the notch filter can be obtained.

A filter according to a third invention comprises of a first and a second integrators. The first integrator includes a first transconductance circuit (2) which performs a voltage-current conversion of a difference between a voltage of a filter input terminal (1) and a voltage of a filter output terminal (10), and a first capacitor (6).

The second integrator includes a second transconductance circuit (3) which performs a voltage-current conversion of a difference between an output voltage of the first integrator and a voltage of the filter output terminal (10), a third transconductance circuit (4) which performs a voltage-current conversion of a difference between the voltage of the filter input terminal (1) and the voltage of the filter output terminal (10) wherein an output current thereof is added to an output current of the second transconductance circuit (3), a fourth transconductance circuit (5) which performs a voltage-current conversion of a difference between the voltage of the filter input terminal (1) and the voltage of the filter output terminal (10) wherein an output current thereof is subtracted from the output current of the second transconductance circuit (3), and a second capacitor (7).

Then, it is configured so that an output voltage of the second integrator and the voltage of the filter input terminal (1) may be added. An output terminal of the second transconductance circuit (3) becomes the filter output terminal (10).

According to this configuration, the third and the fourth transconductance circuits which perform the voltage-current conversion of the difference between the voltage of the filter input terminal and the voltage of the filter output terminal are arranged so that the output current of the third transconductance circuit is added to the output current of the second transconductance circuit, and the output current of the fourth transconductance circuit is subtracted from the output current of the second transconductance circuit. Therefore, by adjusting the third or the fourth transconductance circuit, even when non-ideal characteristics would exist in the first or the second transconductance circuit, those can be canceled, and thereby desired characteristics of the filter, such as the notch filter, the all-pass filter, the bell filter, the dip filter or the like, can be obtained with high accuracy, and a filter which is strong against variations in elements can be obtained. In particular, even when the non-ideal characteristics would exist in the first or the second transconductance circuit, those can be cancelled, and thereby a sufficient attenuation of the notch filter can be obtained.

In the filter of the third invention, for example, a transconductance value of the third transconductance circuit (4)

larger than a transconductance value of the fourth transconductance circuit (5) may be set.

According to this configuration, that makes it possible to configure a filter which can compensate a phase lag when the phase lag would exist in the first integrator, is strong against variations in elements, and is capable of phase compensation.

In addition, in the filter of the third invention, for example, the transconductance value of the third transconductance circuit (4) smaller than the transconductance value of the fourth transconductance circuit (5) may be set.

According to this configuration, that makes it possible to configure a filter which can compensate a phase advance when the phase advance would exist in the first integrator, is strong against variations in elements, and is capable of phase compensation.

A notch filter according to a fourth invention comprises of a first and a second integrators. The first integrator includes a first transconductance circuit (2) which performs a voltage-current conversion of a difference between a voltage of a filter input terminal (1) and a voltage of a filter output terminal (10), and a first capacitor (6).

The second integrator includes a second transconductance circuit (3) which performs a voltage-current conversion of a difference between an output voltage of the first integrator and the voltage of the filter output terminal (10), a third transconductance circuit (4) which performs a voltage-current conversion of a difference between the voltage of the filter input terminal (1) and the voltage of the filter output terminal (10) wherein an output current thereof is added to an output current of the second transconductance circuit (3), and a second capacitor (7).

Then, it is configured so that an output voltage of the second integrator and the voltage of the filter input terminal (1) may be added. An output terminal of the second transconductance circuit (3) becomes the filter output terminal (10).

According to this configuration, the third transconductance circuit which performs the voltage-current conversion of the difference between the voltage of the filter input terminal and the voltage of the filter output terminal is arranged so that the output current of the third transconductance circuit is added to the output current of the second transconductance circuit. Therefore, by adjusting the third transconductance circuit, even when non-ideal characteristics would exist in the first or the second transconductance circuit, those can be canceled, and thereby a sufficient attenuation can be obtained.

A notch filter according to a fifth invention comprises of a first and a second integrators. The first integrator includes a first transconductance circuit (2) which performs a voltage-current conversion of a difference between a voltage of a filter input terminal (1) and a voltage of a filter output terminal (10), and a first capacitor (6).

The second integrator includes a second transconductance circuit (3) which performs a voltage-current conversion of a difference between an output voltage of the first integrator and the voltage of the filter output terminal (10), a third transconductance circuit (5) which performs a voltage-current conversion of a difference between the voltage of the filter input terminal (1) and the voltage of the filter output terminal (10) wherein an output current thereof is subtracted from an output current of the second transconductance circuit (3), and a second capacitor (7).

Then, it is configured so that an output voltage of the second integrator and the voltage of the filter input terminal (1) may be added. An output terminal of the second transconductance circuit (3) becomes the filter output terminal (10).

According to this configuration, the third transconductance circuit which performs the voltage-current conversion of the difference between the voltage of the filter input terminal and the voltage of the filter output terminal is arranged so that the output current of the third transconductance circuit is subtracted from the output current of the second transconductance circuit. Therefore, by adjusting the third transconductance circuit, even when non-ideal characteristics would exist in the first or the second transconductance circuit, those can be canceled, and thereby a sufficient attenuation can be obtained.

A notch filter according to a sixth invention comprises of a first and a second integrators. The first integrator includes a first transconductance circuit (2) which performs a voltage-current conversion of a difference between a voltage of a filter input terminal (1) and a voltage of a filter output terminal (10), and a first capacitor (6).

The second integrator includes a second transconductance circuit (3) which performs a voltage-current conversion of a difference between an output voltage of the first integrator and the voltage of the filter output terminal (10), a third transconductance circuit (4) which performs a voltage-current conversion of a difference between the voltage of the filter input terminal (1) and the voltage of the filter output terminal (10) wherein an output current thereof is added to an output current of the second transconductance circuit (3), a fourth transconductance circuit (5) which performs a voltage-current conversion of a difference between the voltage of the filter input terminal (1) and the voltage of the filter output terminal (10) wherein an output current thereof is subtracted from the output current of the second transconductance circuit (3), and a second capacitor (7).

Then, it is configured so that an output voltage of the second integrator and the voltage of the filter input terminal (1) may be added. An output terminal of the second transconductance circuit (3) becomes the filter output terminal (10).

According to this configuration, the third and the fourth transconductance circuits which perform the voltage-current conversion of the difference between the voltage of the filter input terminal and the voltage of the filter output terminal are arranged so that the output current of the third transconductance circuit is added to the output current of the second transconductance circuit, and the output current of the fourth transconductance circuit is subtracted from the output current of the second transconductance circuit. Therefore, by adjusting the third or the fourth transconductance circuit, even when non-ideal characteristics would exist in the first or the second transconductance circuit, those can be canceled, and thereby a sufficient attenuation can be obtained.

An all-pass filter according to a seventh invention comprises of a first and a second integrators. The first integrator includes a first transconductance circuit (2) which performs a voltage-current conversion of a difference between a voltage of a filter input terminal (1) and a voltage of a filter output terminal (10), and a first capacitor (6).

The second integrator includes a second transconductance circuit (3) which performs a voltage-current conversion of a difference between an output voltage of the first integrator and the voltage of the filter output terminal (10), a third transconductance circuit (5) which performs a voltage-current conversion of a difference between the voltage of the filter input terminal (1) and the voltage of the filter output terminal (10) wherein an output current thereof is subtracted from an output current of the second transconductance circuit (3), and a second capacitor (7).

Then, it is configured so that an output voltage of the second integrator and the voltage of the filter input terminal (1) may be added. An output terminal of the second transconductance circuit (3) becomes the filter output terminal (10).

According to this configuration, the third transconductance circuit which performs the voltage-current conversion of the difference between the voltage of the filter input terminal and the voltage of the filter output terminal is arranged so that the output current of the third transconductance circuit is subtracted from the output current of the second transconductance circuit. Therefore, by adjusting the third transconductance circuit, even when non-ideal characteristics would exist in the first or the second transconductance circuit, those can be canceled, and thereby all-pass filter characteristics with high accuracy can be obtained, and, moreover, an all-pass filter which is strong against variations in elements can be obtained.

An all-pass filter according to an eighth invention comprises of a first and a second integrators. The first integrator includes a first transconductance circuit (2) which performs a voltage-current conversion of a difference between a voltage of a filter input terminal (1) and a voltage of a filter output terminal (10), and a first capacitor (6).

The second integrator includes a second transconductance circuit (3) which performs a voltage-current conversion of a difference between an output voltage of the first integrator and the voltage of the filter output terminal (10), a third transconductance circuit (4) which performs a voltage-current conversion of a difference between the voltage of the filter input terminal (1) and the voltage of the filter output terminal (10) wherein an output current thereof is added to an output current of the second transconductance circuit (3), a fourth transconductance circuit (5) which performs a voltage-current conversion of a difference between a voltage of the filter input terminal (1) and a voltage of the filter output terminal (10) wherein an output current thereof is subtracted from the output current of the second transconductance circuit (3), and a second capacitor (7).

Then, it is configured so that an output voltage of the second integrator and the voltage of the filter input terminal (1) may be added.
☐An output terminal of the second transconductance circuit (3) becomes the filter output terminal (10).

According to this configuration, the third and the fourth transconductance circuits which perform the voltage-current conversion of the difference between the voltage of the filter input terminal and the voltage of the filter output terminal are arranged so that the output current of the third transconductance circuit is added to the output current of the second transconductance circuit, and the output current of the fourth transconductance circuit is subtracted from the output current of the second transconductance circuit. Therefore, by adjusting the third or the fourth transconductance circuit, even when non-ideal characteristics would exist in the first or the second transconductance circuit, those can be canceled, and thereby all-pass filter characteristics with high accuracy can be obtained, and, moreover, an all-pass filter which is strong against variations in elements can be obtained.

A filter according to a ninth invention comprises of a first and a second integrators. The first integrator includes a first full differential transconductance circuit (20) which performs a voltage-current conversion of a difference between a voltage of a positive phase filter input terminal (1A) and a voltage of a negative phase filter input terminal (1B), a second full differential transconductance circuit (13) which performs a voltage-current conversion of a difference between a voltage of a positive phase filter output terminal (10A) and a voltage of a negative phase filter output terminal (10B), and a first capacitor (60).

The second integrator includes a third full differential transconductance circuit (14) which performs a voltage-current conversion between a difference of a voltage of a positive polarity output terminal and a voltage of a negative polarity output terminal of the first integrator, a fourth full differential transconductance circuit (40) which performs a voltage-current conversion of a difference between the voltage of the positive phase filter input terminal (1A) and the voltage of the positive phase filter output terminal (10A) wherein an output current thereof is added to an output current of the third full differential transconductance circuit (14), a fifth full differential transconductance circuit (50) which performs a voltage-current conversion of a difference between the voltage of the negative phase filter input terminal (1B) and the voltage of the negative phase filter output terminal (10B) wherein an output current thereof is added to the output current of the third full differential transconductance circuit (14), a sixth full differential transconductance circuit (30) which performs a voltage-current conversion of a difference between the voltage of the positive phase filter output terminal (10A) and the negative phase filter output terminal (10B), and second capacitors (71, 72).

Then, it is configured so that a voltage of a positive polarity output terminal of the second integrator and the voltage of the positive phase filter input terminal (1A) may be added, and a voltage of a negative polarity output terminal of the second integrator and the voltage of the negative phase filter input terminal (1B) may be added as well. The positive polarity output terminal and the negative polarity output terminal of the third full differential transconductance circuit (14) become the positive phase filter output terminal (10A) and the negative phase filter output terminal (10B), respectively.

According to this configuration, the fourth full differential transconductance circuit which performs the voltage-current conversion of the difference between the voltage of the positive phase filter input terminal and the voltage of the positive phase filter output terminal, and the fifth full differential transconductance circuit which performs the voltage-current conversion of the difference of the voltage of the negative phase filter input terminal and the voltage of the negative phase filter output terminal are added to the second integrator so that the output current of the fourth full differential transconductance circuit is added to the output current of the third full differential transconductance circuit, and the output current of the fifth full differential transconductance circuit is added to the output current of the third full differential transconductance circuit. Therefore, by adjusting the fourth or the fifth full differential transconductance circuit, even when non-ideal characteristics would exist in the first, the second, or the third full differential transconductance circuit, those can be canceled, and thereby desired characteristics of the filter, such as a notch filter, a all-pass filter, a bell filter, a dip filter or the like can be obtained with high accuracy, and a filter which is strong against variations in elements can be obtained. In particular, even when non-ideal characteristics would exist in the first, the second, or the third full differential transconductance circuit, those can be canceled, and thereby a sufficient attenuation of the notch filter can be obtained.

A filter according to a 10th invention comprises of a first and a second integrators. The first integrator includes a first full differential transconductance circuit (20) which performs a voltage-current conversion of a difference between a voltage of a positive phase filter input terminal (1A) and a voltage of a negative phase filter input terminal (1B), a second full differential transconductance circuit (13) which performs a voltage-current conversion of a difference between a voltage of a positive phase filter output terminal (10A) and a voltage of a negative phase filter output terminal (10B), and a first capacitor (60).

The second integrator includes a third full differential transconductance circuit (14) which performs a voltage-current conversion between a difference of a voltage of a positive polarity output terminal and a voltage of a negative polarity output terminal of the first integrator, a fourth full differential transconductance circuit (40) which performs a voltage-current conversion of a difference between the voltage of the positive phase filter input terminal (1A) and the voltage of the negative phase filter input terminal (1B) wherein an output current thereof is added to an output current of the third full differential transconductance circuit (14) with positive polarity, a fifth full differential transconductance circuit (50) which performs a voltage-current conversion of a difference between the voltage of the positive phase filter input terminal (1A) and the voltage of the negative phase filter input terminal (1B) and wherein an output current thereof is added to the output current of the third full differential transconductance circuit (14) with reversed polarity, a sixth full differential transconductance circuit (18) which performs a voltage-current conversion of a difference between the voltage of the positive phase filter output terminal (10A) and the voltage of the negative phase filter output terminal (10B) wherein an output current thereof is added to the output current of the third full differential transconductance circuit (14) with positive polarity, a seventh full differential transconductance circuit (19) which performs a voltage-current conversion of a difference between the voltage of the positive phase filter output terminal (10A) and the voltage of the negative phase filter output terminal (10B) wherein an output current thereof is added to the output current of the third full differential transconductance circuit (14) with reversed polarity, a eighth full differential transconductance circuit (30) which performs a voltage-current conversion of a difference between a voltage of a positive phase filter output terminal and a negative phase filter output terminal, and second capacitors (71, 72).

Then, it is configured so that a voltage of a positive polarity output terminal of the second integrator and the voltage of the positive phase filter input terminal (1A) may be added, and a voltage of a negative polarity output terminal of the second integrator and the voltage of the negative phase filter input terminal (1B) may be added as well. The positive polarity output terminal and the negative polarity output terminal of the third full differential transconductance circuit (14) become the positive phase filter output terminal (10A) and the negative phase filter output terminal (10B), respectively.

According to this configuration, the fourth and the fifth full differential transconductance circuit which perform the voltage-current conversion of the difference between the voltage of the positive phase filter input terminal and the voltage of the negative phase filter input terminal, and the sixth and the seventh full differential transconductance circuit which perform the voltage-current conversion of the difference of the voltage of the positive phase filter output terminal and the voltage of the negative phase filter output terminal are added to the second integrator so that the output current of the fourth and the sixth full differential transconductance circuit is added to the output current of the third full differential transconductance circuit with positive polarity, and the output current of the fifth and the seventh full differential transconductance circuit is added to the output current of the third full differential transconductance circuit with reversed polarity. Therefore, by adjusting the fourth, the fifth, the sixth, or the seventh full differential transconductance circuit, even when non-ideal characteristics would exist in the first, the second, or the third full differential transconductance circuit, those can be canceled, and thereby desired characteristics of the filter, such as the notch filter, the all-pass filter, the bell filter, the dip filter or the like can be obtained with high accuracy, and a filter which is strong against variations in elements can be obtained. In particular, even when the non-ideal characteristics would exist in the first, the second, or the third transconductance circuit, those can be canceled, and thereby a sufficient attenuation of the notch filter can be obtained.

As described above, according to the present invention, it is possible to cancel the non-ideal effect of the operational amplifier or the transconductance circuit, and to realize the ideal notch filter. In addition, it is possible to control the depth of the notch, and the all-pass filter with high accuracy, which cancels the non-ideal effect of the transconductance circuit, can also be realized. Moreover, desired characteristics of the filter can be obtained with high accuracy.

DETAILED DESCRIPTION OF THE INVENTION

Figure 1:
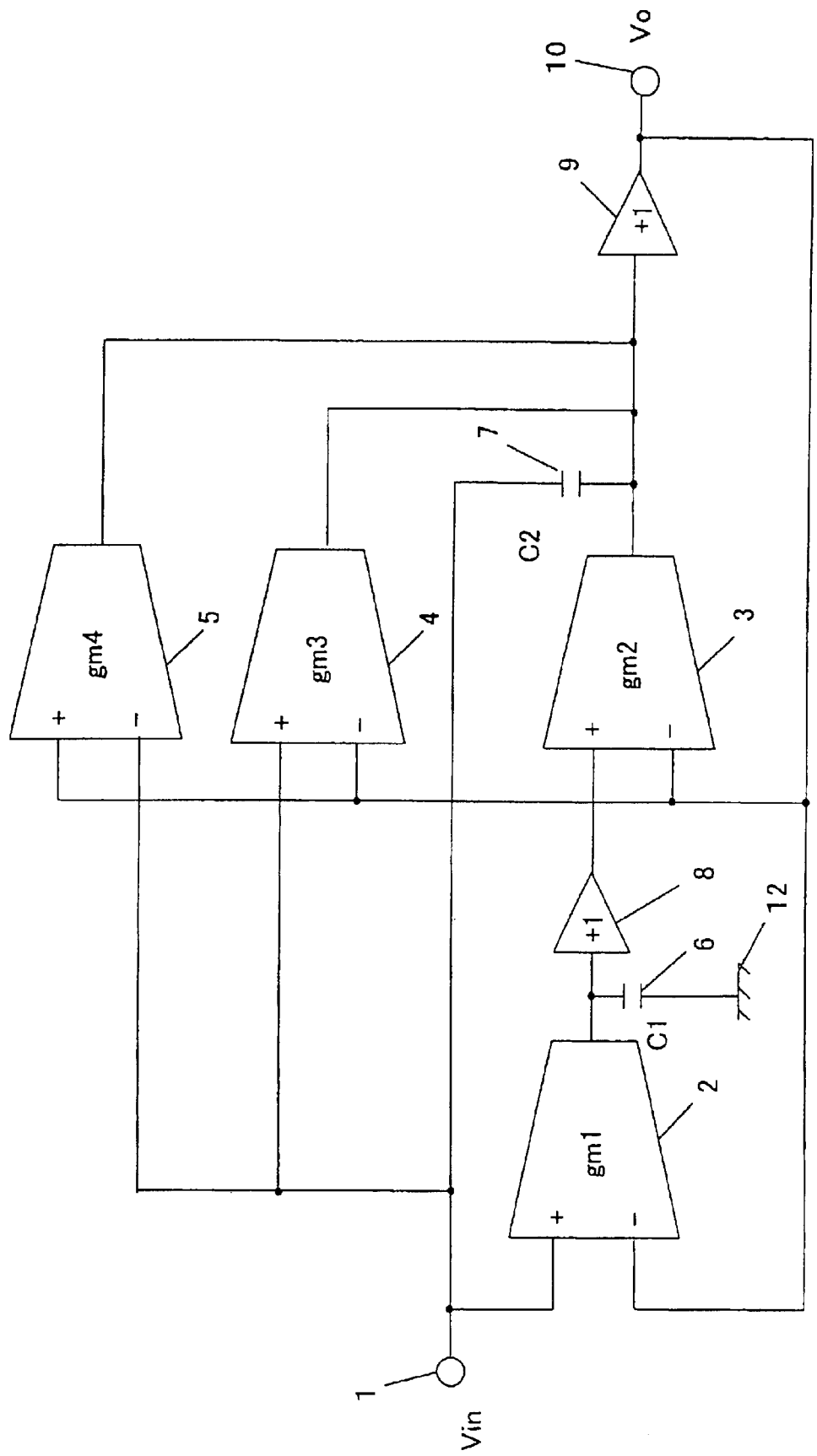
FIG. 1 is a circuit diagram showing a filter circuit configuration according to a first embodiment of the present invention.

FIG. 1 shows a first embodiment according to the present invention. Hereafter, referring to FIG. 1, the first embodiment will be described.

In FIG. 1, reference numeral 1 represents a filter input terminal, reference numerals 2, 3, 4, and 5 represent transconductance circuits which have transconductance values gm1, gm2, gm3, and gm4, respectively, reference numerals 6 and 7 represent capacitors which have capacitance values C1 and C2, respectively, and reference numerals 8 and 9 represent voltage buffer circuits, respectively. Reference numeral 10 represents a filter output terminal, and reference numeral 12 represents a ground terminal.

Supposing that transconductance values of the transconductance circuits 2, 3, 4, and 5 are gm1, gm2, gm3, and gm4, respectively, and capacitance values of the capacitors 6 and 7 are C1 and C2, respectively, a transfer function H(s) from the filter input terminal 1 to the filter output terminal 10 is expressed as follows.

$$H(s) = Vo/Vin \quad (6)$$
$$= [s^2 + s(gm3 - gm4)/C2 + gm1gm2/(C1C2)] /$$
$$(s^2 + s(gm2 + gm3 - gm4)/C2 + gm1gm2/(C1C2))]$$

Accordingly, supposing that gm3=gm4, it becomes a notch filter.

Here, defining that a frequency characteristic of the transconductance gm1 is $G(s) = \omega a/(s+\omega a)$, and approximating that the transfer function H (s) including an output resistance RL is as follows, $$H(s) = Vo/Vin \quad (7)$$
$$= (s^2 + s(1/C1RL + (gm3 - gm4)/C2 - gm1gm2/$$
$$C1C2\omega a) + gm1gm2/(C1C2))/(s^2 + s((gm2 +$$
$$gm3 - gm4 - gm1gm2/\omega aC1)/C2 + 1/C1RL) +$$
$$((gm1gm2 + (gm2 + gm3 - gm4)/RL)/(C1C2))$$

Here, in order to make a primary term of a numerator to be 0, it is chosen as follows.

$$gm3-gm4=gm1gm2/C1\omega a-C2/(C1RL) \quad (8)$$

By making like this, that makes it possible to obtain complete notch characteristics.

Accordingly, it is possible to cancel a non-ideal effect of the transconductance circuit.

In addition, in equation (6), when gm2=2 (gm4−gm3), gm4>gm3, it is possible to configure an all-pass filter.

In addition, in the same equation, when 2 (gm4−gm3)< gm2, a dip filter is configured.

In addition, in the same equation, when 2 (gm4−gm3)> gm2, it becomes a bell filter.

As described above, according to the first embodiment of the present invention, the transconductance circuits 4 and 5 which perform a voltage-current conversion of a difference between a voltage of the filter input terminal 1 and a voltage of the filter output terminal 10 are arranged so that an output current of the transconductance circuit 4 is added to an output current of the transconductance circuit 3, and an output current of the transconductance circuit 5 is subtracted from the output current of the transconductance circuit 3. Therefore, by adjusting the transconductance circuits 4 or 5, even when non-ideal characteristics would exist in the transconductance circuits 2 or 3, those can be canceled, and thereby desired characteristics of the filter, such as a notch filter, an all-pass filter, a bell filter, a dip filter or the like, can be obtained with high accuracy, and a filter which is strong against variations in elements can be obtained. In particular, even when the non-ideal characteristics would exist in the transconductance circuits 2 and 3, those can be canceled, and thereby a sufficient attenuation of the notch filter can be obtained.

Incidentally, regarding other types of filters, similarly, it is possible to compensate a deviation, which the non-ideal effect of the transconductance circuit gives to the transfer function, from the ideal characteristics.

Incidentally, in the above embodiment, although both transconductance circuits 4 and 5 are arranged, in order to cancel the non-ideal characteristics or obtain the target filter characteristics, both transconductance circuits 4 and 5 are not always needed; in order to adjust to the target characteristics, there is a case where only either of them may be arranged.

In addition, the voltage buffer circuits 8 and 9 may be omitted.

Figure 2:
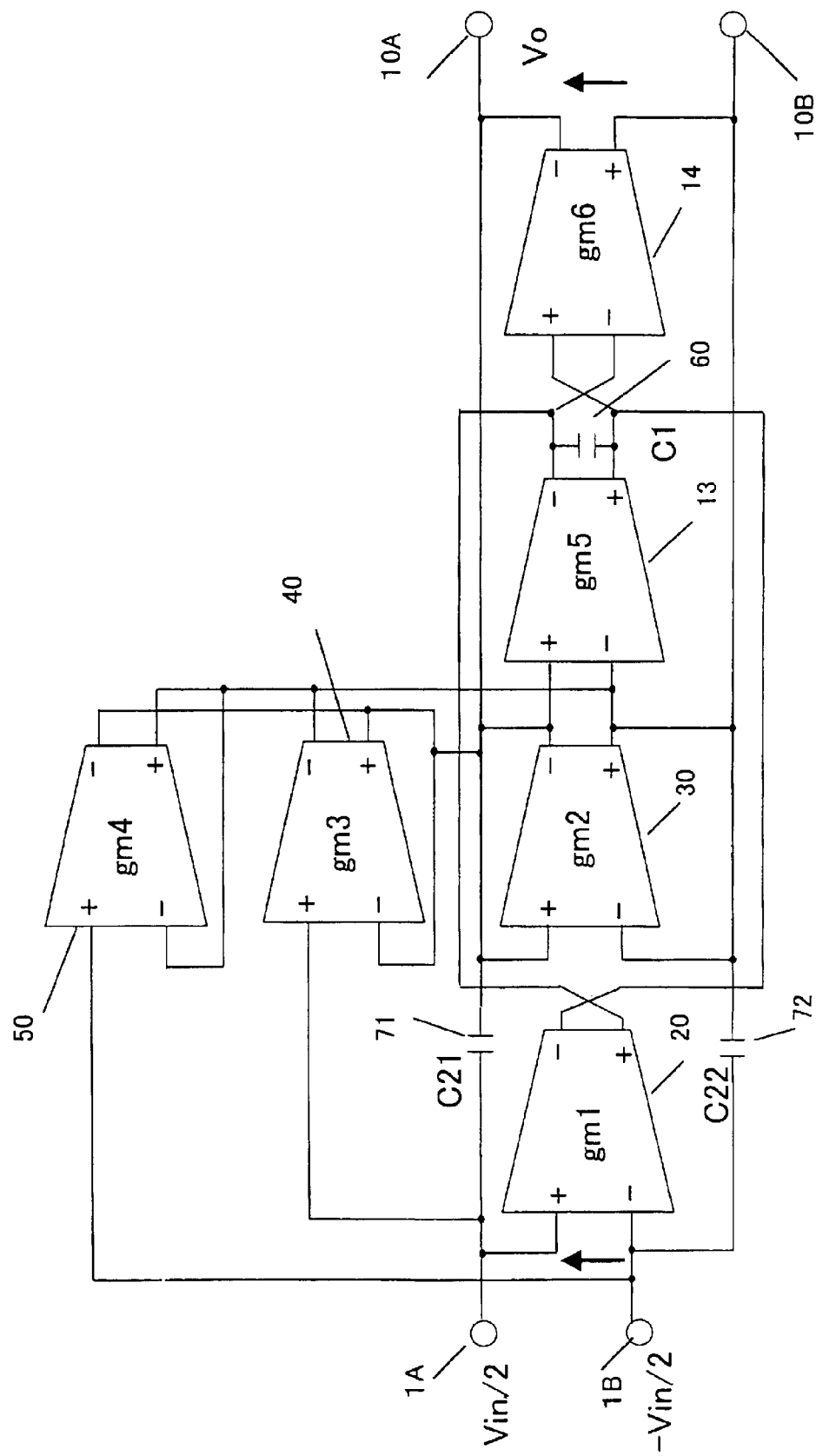
FIG. 2 is a circuit diagram showing a filter circuit configuration according to a second embodiment of the present invention.
Figure 6:
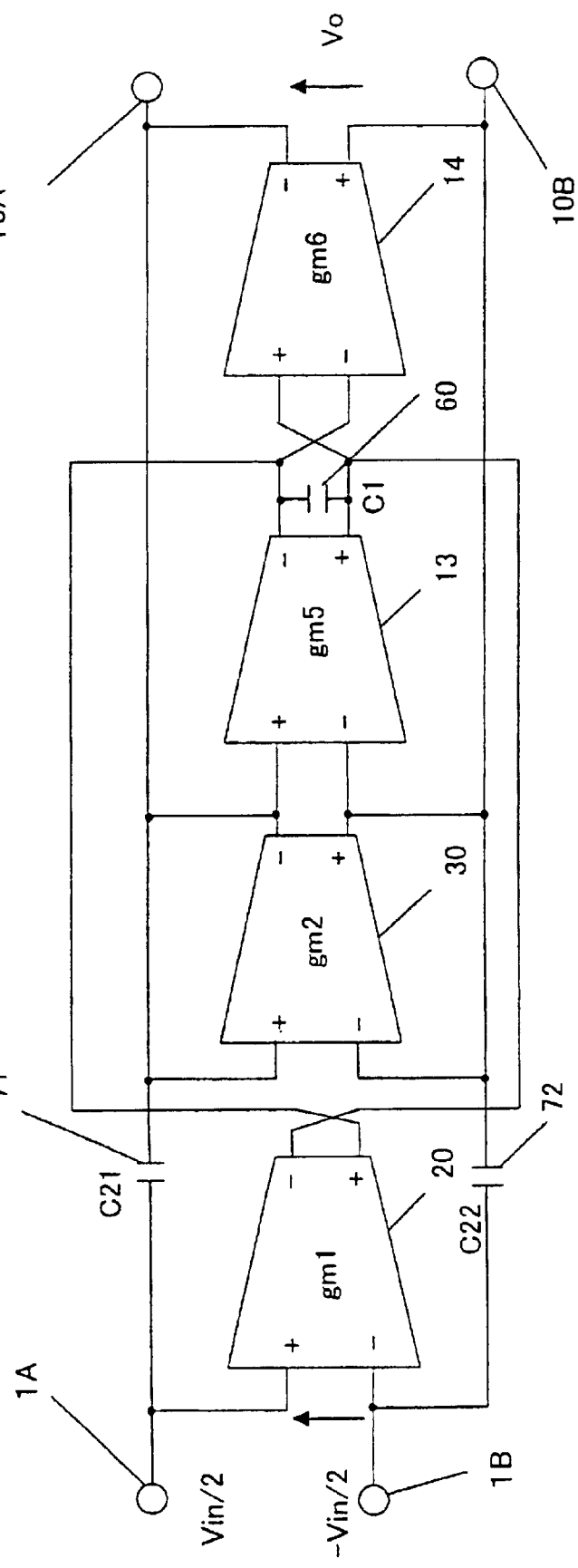
FIG. 6 is a circuit diagram showing a second example of a notch filter according to a prior art.
Figure 7:
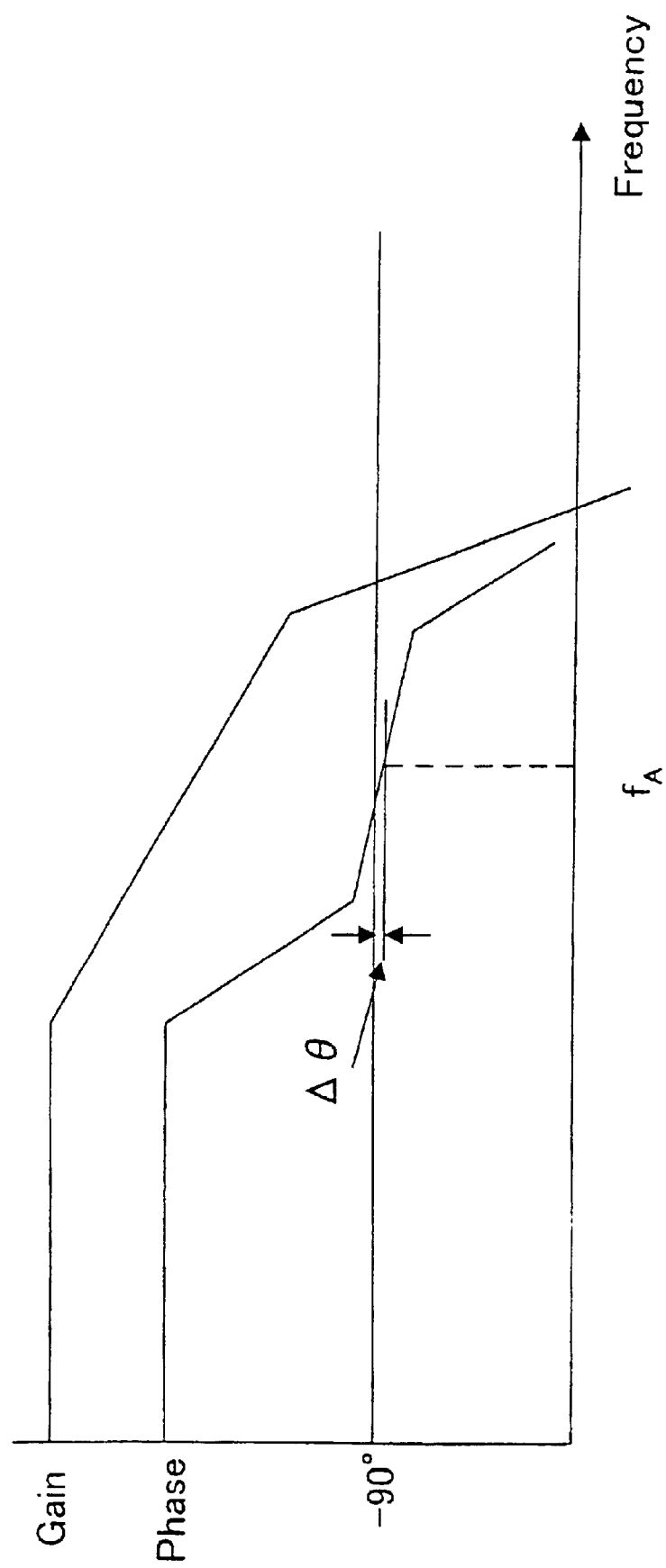
FIG. 7 is a characteristics chart showing an error of an integrator due to a non-ideal effect of a notch filter according to a prior art.
Figure 8:
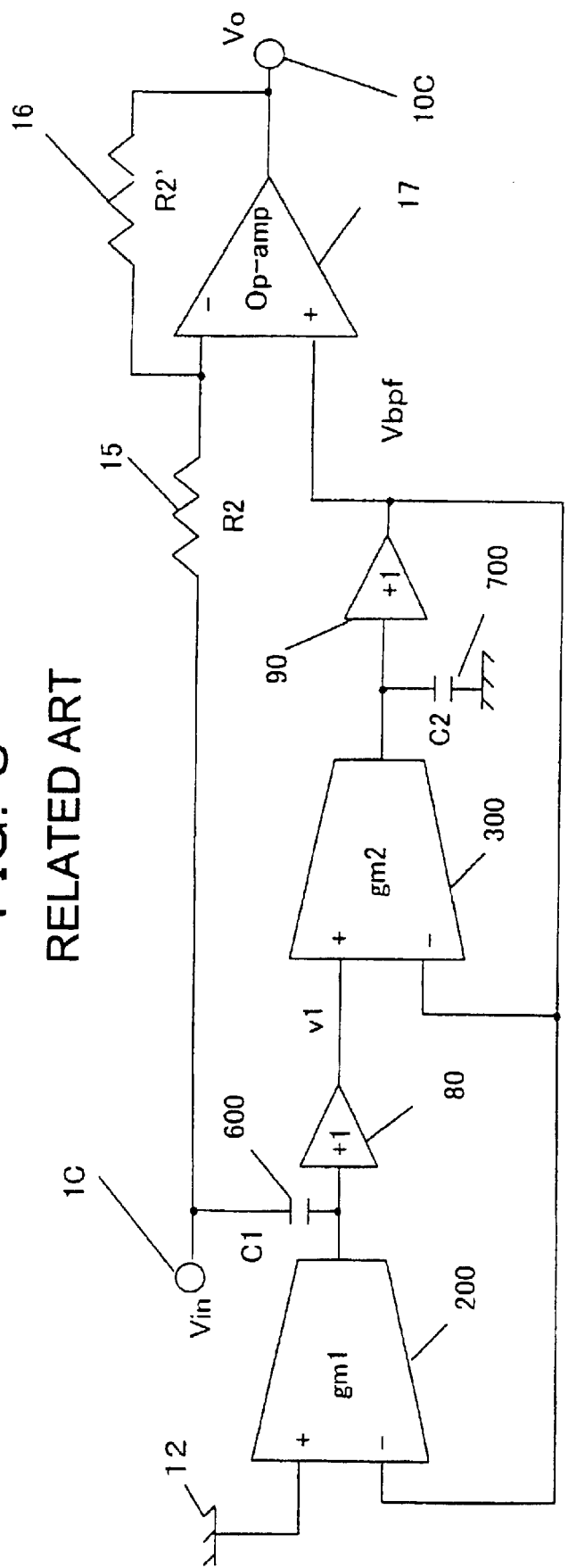
FIG. 8 is a circuit diagram showing an all-pass filter circuit configuration according to a prior art.
Figure 9:
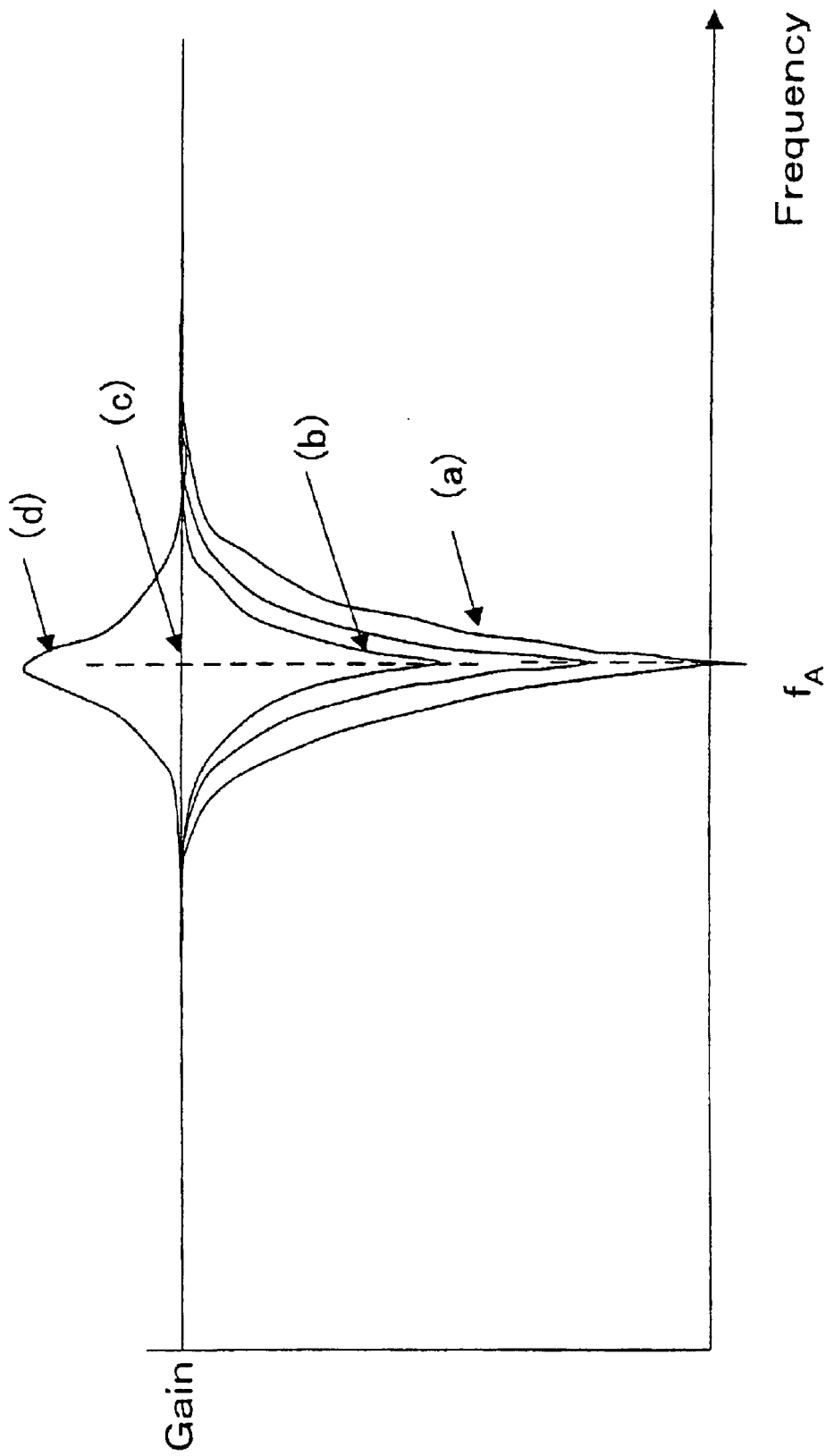
FIG. 9 is a characteristics chart showing various filter characteristics.
Figure 10:
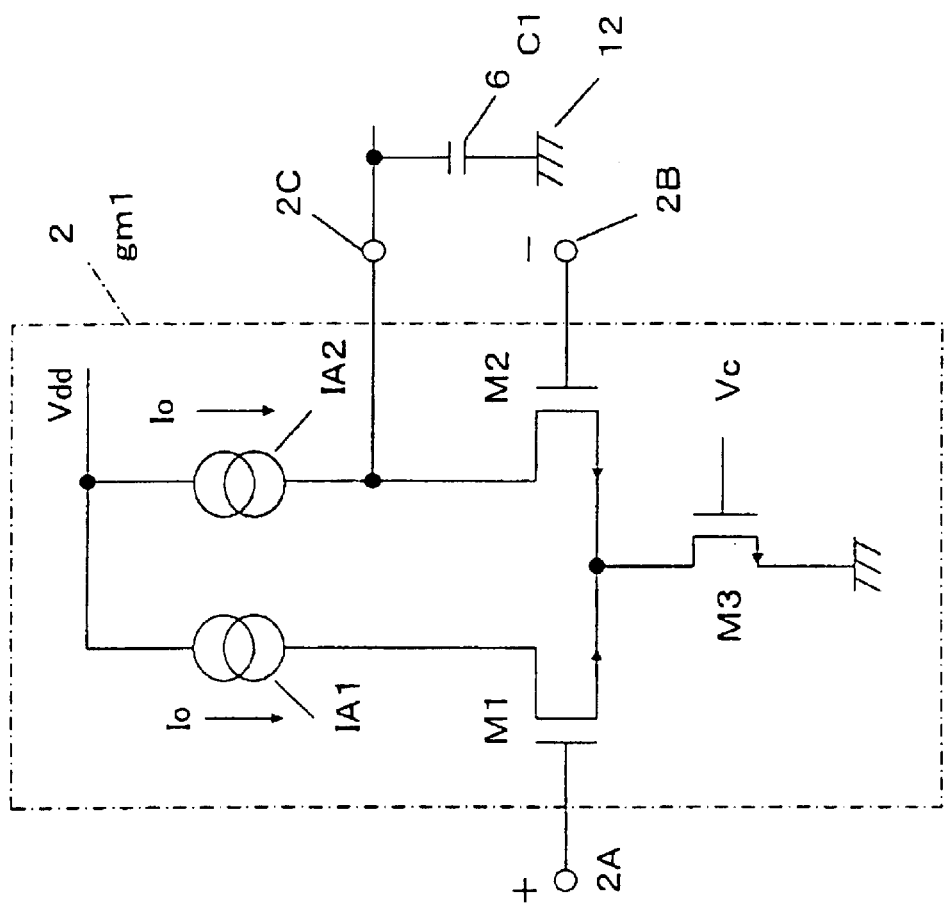
FIG. 10 is a circuit diagram showing a specific circuit example of a transconductance circuit 2.
Figure 11:
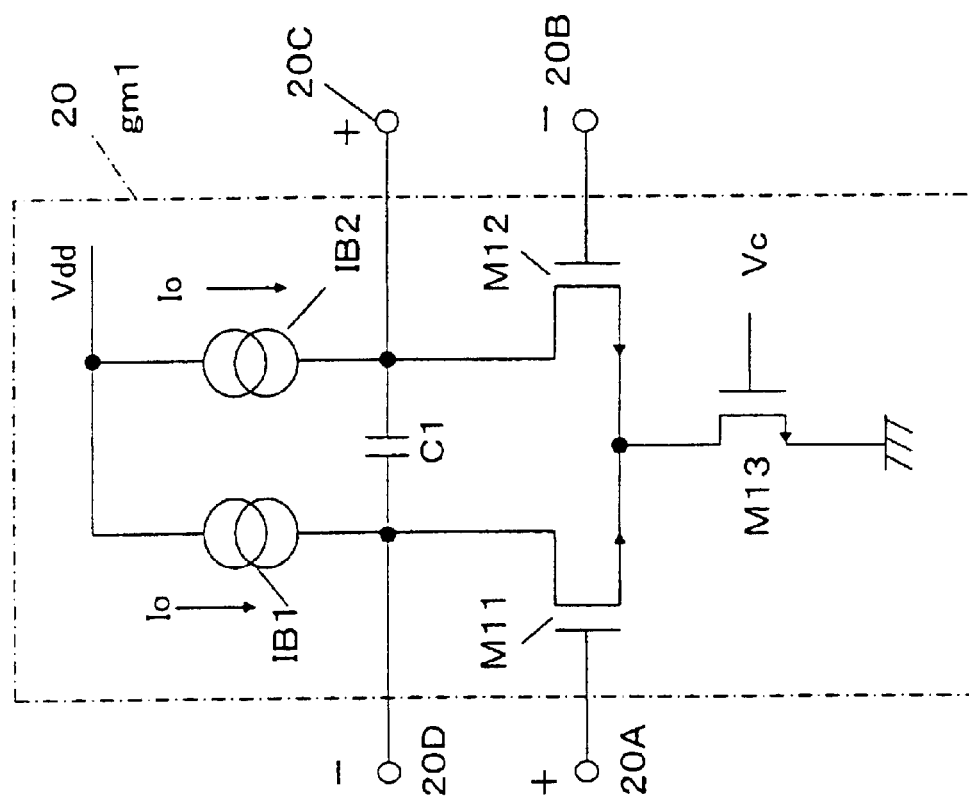
FIG. 11 is a circuit diagram showing a specific circuit example of a full differential transconductance circuit 20.

A second embodiment according to the present invention is shown in FIG. 2. In FIG. 2, reference numeral 1A represents a positive phase filter input terminal, reference numeral 1B represents a negative phase filter input terminal, reference numerals 20, 30, 40, 50, 13, and 14 represent full differential transconductance circuits, respectively, and reference numerals 60, 71, and 72 represent capacitors, respectively. Except that the full differential transconductance circuits 40 and 50 which have transconductance values gm3 and gm4, respectively, are added, it is the same as that of a prior art in FIG. 6.

Supposing that transconductance values of transconductance circuits 20, 30, 40, 50, 13, and 14 are gm1, gm2, gm3, gm4, gm5, and gm6, respectively, a capacitance value of capacitor 60 is C1, capacitance values of capacitors 71 and 72 are C21 and C22, respectively, and C21=C22=C2, a transfer function H(s) of this circuit becomes as follows. That is, the transfer function H (s) is $$H(s) = Vo/Vin \quad (9)$$
$$= (s^2 + s((gm3 - gm4)/C2) + 2gm1gm6/(C1C2))/$$
$$(s^2 + s((2gm2 + gm3 - gm4)/C2) + (2gm5gm6/(C1C2))$$

When gm3=gm4, it becomes the notch filter.

In addition, when gm4−gm3=gm2, it becomes the all-pass filter.

Figure 5:
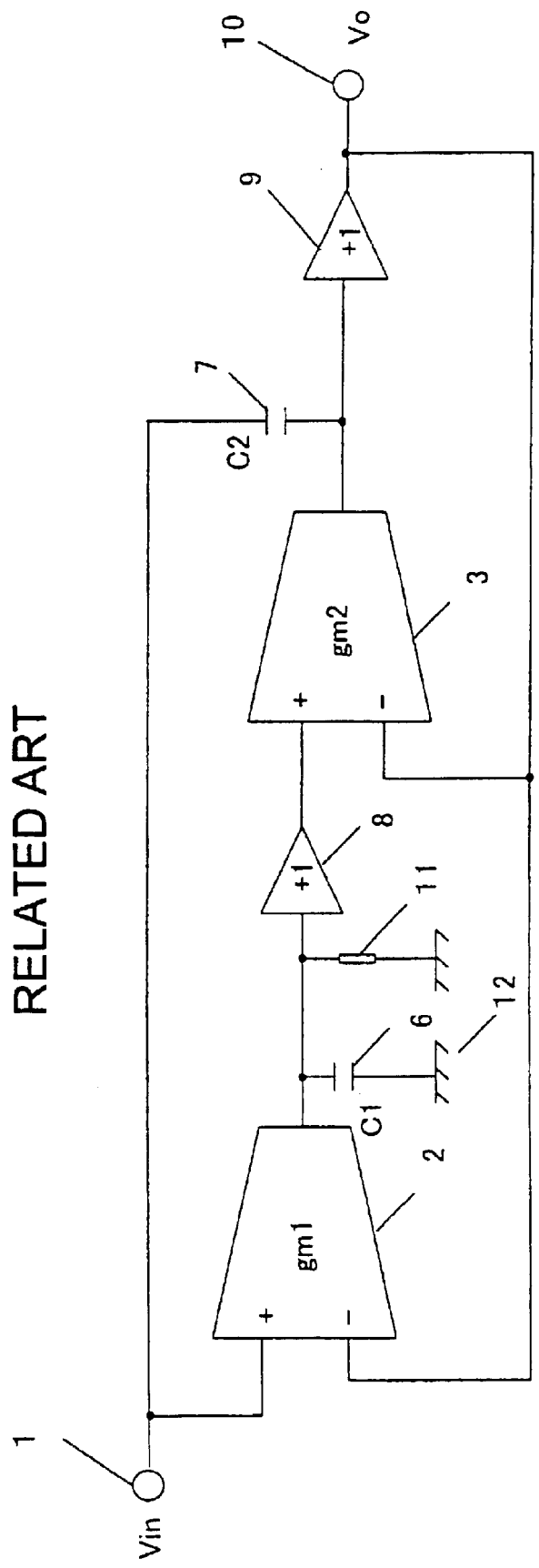
FIG. 5 is a characteristics chart explaining a non-ideal effect of a notch filter according to a prior art.

However, as shown in FIG. 5, a primary term is left in the transfer function H(s) of the notch filter due to a non-ideal effect of the transconductance circuit.

The primary term becomes (gm3−gm4)/C2+(A−B), when a component S*A−S*B (S=jω, A, and B are positive values) of the non-ideal effect is added. Accordingly, in order to make it to be a notch completely, gm3 and gm4 may be chosen so that (gm3−gm4)/C2+(A−B)=0.

According to this embodiment, the full differential transconductance circuit 40 which performs the voltage-current conversion of the difference between the voltage of the positive phase filter input terminal 1A and the voltage of the positive phase filter output terminal 10A, and the full differential transconductance circuit 50 which performs the voltage-current conversion of the difference between the voltage of the negative phase filter input terminal 1B and the voltage of the negative phase filter output terminal 10B are added to the integrator which consists of the transconductance circuit 13 and the capacitor 60 so that an output current of the full differential transconductance circuit 40 is added to an output current of the full differential transconductance circuit 14, and an output current of the full differential transconductance circuit 50 is added to the output current of the full differential transconductance circuit 14. Therefore, by adjusting the transconductance circuits 40 or 50, even when non-ideal characteristics would exist in the transconductance circuits 20, 30, 13 or 14, those can be canceled, and thereby desired characteristics of the filter, such as a notch filter, an all-pass filter, a bell filter, a dip filter or the like, can be obtained with high accuracy, and a filter which is strong against variations in elements can be obtained. In particular, even when the non-ideal characteristics would exist in the full differential transconductance circuits 20, 30, 13, and 14, those can be canceled, and thereby a sufficient attenuation of the notch filter can be obtained.

Incidentally, in order to cancel the non-ideal characteristics or obtain the target filter characteristics, it is also possible to omit either of the full differential transconductance circuits 40 and 50.

Incidentally, similar to other types of filters, it is possible to correct an error which the non-ideal effect of the transconductance circuit gives to the transfer function.

Figure 3:
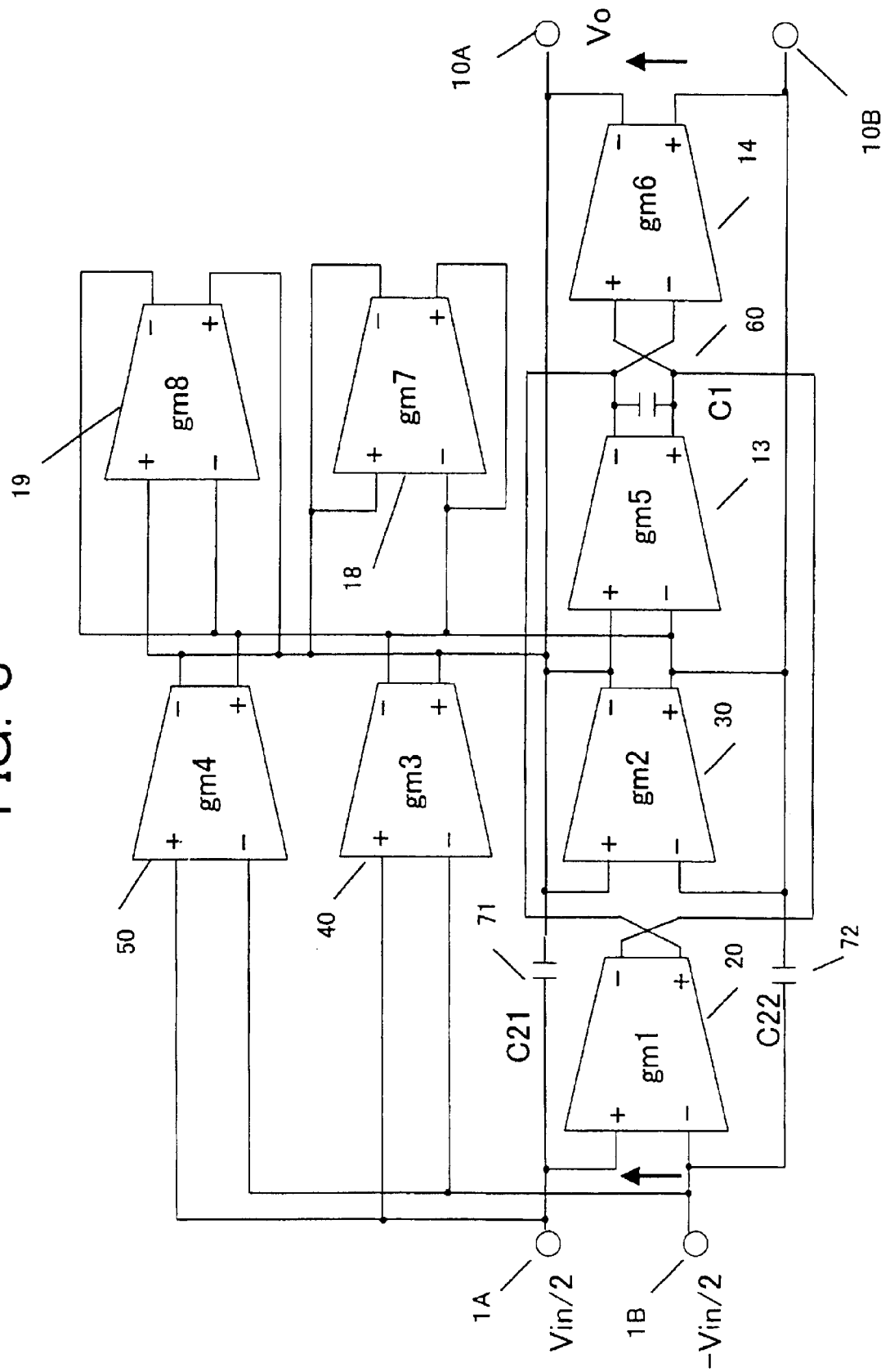
FIG. 3 is a circuit diagram showing a filter circuit configuration according to a third embodiment of the present invention.
Figure 4:
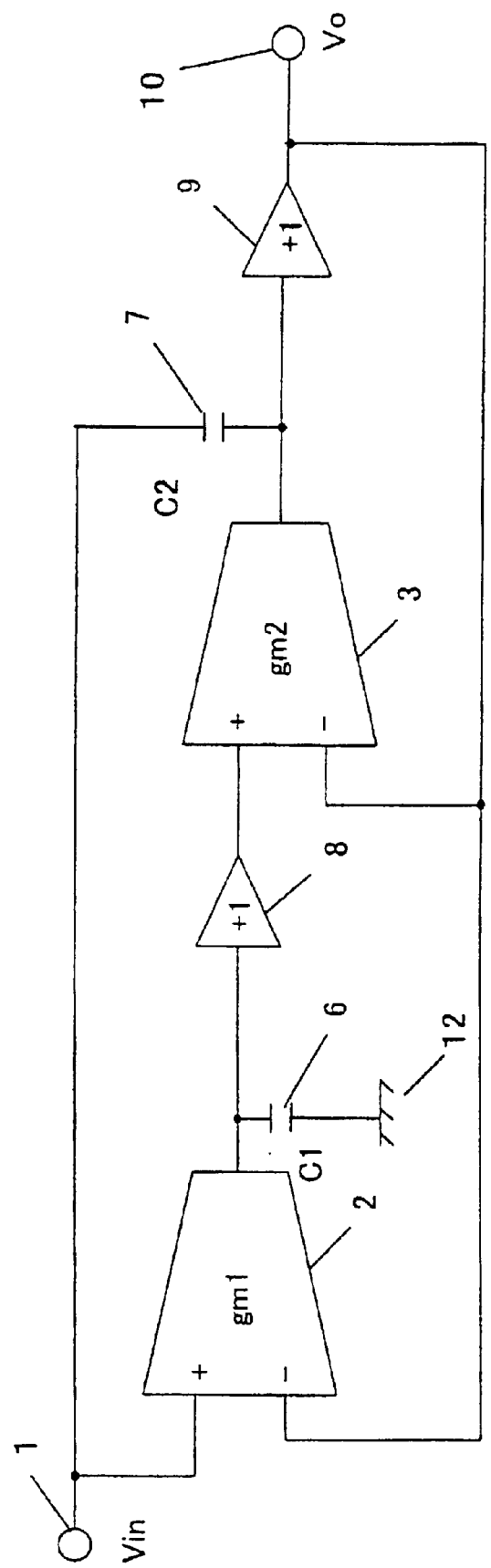
FIG. 4 is a circuit diagram showing a notch filter circuit configuration according to a prior art.

A third embodiment according to the present invention is shown in FIG. 3. In FIG. 3, reference numeral 1A represents a positive phase filter input terminal, reference numeral 1B represents a negative phase filter input terminal, reference numerals 20, 30, 40, 50, 13, 14, 18, and 19 represent full differential transconductance circuits, respectively, and reference numerals 60, 71, and 72 represent capacitors, respectively. Except that the full differential transconductance circuits 40, 50, 18, and 19 are added, it is the same as that of the prior art in FIG. 6.

Supposing that transconductance values of transconductance circuits 20, 30, 40, 50, 13, 14, 18, and 19 are gm1, gm2, gm3, gm4, gm5, gm6, gm7, and gm8, respectively, a capacitance value of a capacitor 60 is C1, capacitance values of capacitors 71 and 72 are C21 and C22, respectively, and C21=C22=C2, a transfer function H(s) of this circuit becomes as follows. That is, the transfer function H (s) is $$H(s) = Vo/Vin \quad (10)$$
$$= (s^2 + s((gm3 - gm4)/C2) + 2gm1gm6/(C1C2))/$$
$$(s^2 + s((gm2 + gm7 - gm8)/C2) +$$
$$(2gm5gm6/(C1C2))$$

When gm3=gm4, it becomes the notch filter.

In addition, when gm4−gm3=gm2+gm7−gm8, it becomes the all-pass filter.

However, as shown in FIG. 5, a primary term is left in the transfer function H(s) of the notch filter due to the non-ideal effect of the transconductance circuit.

The primary term becomes (gm3−gm4)/C2+(A−B), when a component S*A−S*B (S=jω, A, and B are positive values) of the non-ideal effect is added. Accordingly, in order to make it to be a notch completely, it is necessary to choose gm3 and gm4 as (gm3−gm4)/C2+(A−B)=0.

According to this embodiment, the full differential transconductance circuits 40 and 50 which perform the voltage-current conversion of the difference between the voltage of the positive phase filter input terminal 1A and the voltage of the negative phase filter input terminal 1B, and the full differential transconductance circuits 18 and 19 which perform the voltage-current conversion of the difference between the voltage of the positive phase filter output terminal and the voltage of the negative phase filter output terminal are added to the integrator which consists of the transconductance circuit 13 and the capacitor 60 so that an output current of the full differential transconductance circuit 40 and 18 is added to an output current of the full differential transconductance circuit 14 with positive polarity, and an output current of the full differential transconductance circuit 50 and 19 is added to an output current of the full differential transconductance circuit 14 with reversed polarity. Therefore, by adjusting the transconductance circuits 40, 50, 18, or 19, even when non-ideal characteristics would exist in the transconductance circuits 20, 30, 13 or 14, those can be canceled, and thereby desired characteristics of the filter, such as a notch filter, an all-pass filter, a bell filter, a dip filter or the like, can be obtained with high accuracy, and a filter which is strong against variations in elements can be obtained. In particular, even when the non-ideal characteristics would exist in the full differential transconductance circuits 20, 30, 13, and 14, those can be canceled, and thereby a sufficient attenuation of the notch filter can be obtained.

Incidentally, in order to cancel the non-ideal characteristics or obtain the target filter characteristics, it is also possible to omit either of the full differential transconductance circuits 40 and 50, or either of the full differential transconductance circuits 18 and 19.

Incidentally, regarding other types of filters, it is possible to compensate a deviation of primary terms of a denominator and a numerator of the transfer function due to the non-ideal effect of the transconductance circuit to make it into an ideal state.

Also regarding the all-pass filter, when a component S*A−S*B of the non-ideal effect of the primary term is added to the numerator in equation (10), it becomes (gm3−gm4)/C2+(A−B). Accordingly, in order to make it to be an all-pass filter perfectly, it is necessary to choose gm3, gm4, gm7, and gm8 so that they may satisfy (gm4−gm3)/C2+(B−A)=(gm2+gm7−gm8)/C2.

What is claimed is:

1. A filter, comprising:

a first integrator including a first transconductance circuit, which performs a voltage-current conversion of a difference between a voltage of a filter input terminal and a voltage of a filter output terminal, and a first capacitor; and a second integrator including
        a second transconductance circuit which performs a voltage-current conversion of a difference between an output voltage of said first integrator and the voltage of said filter output terminal,
        a third transconductance circuit, which performs a voltage-current conversion of a difference between the voltage of said filter input terminal and the voltage of said filter output terminal, wherein an output current thereof is added to an output current of said second transconductance circuit, and
        a second capacitor, wherein:

said first capacitor is connected between an output terminal of said first transconductance circuit and a ground terminal, said second capacitor is connected between said filter input terminal and an output terminal of said second transconductance circuit, the voltage of said second integrator via said second capacitor, and the output terminal of said second transconductance circuit is an output terminal of said filter.

2. A filter, comprising:
   a first integrator including a first transconductance circuit, which performs a voltage-current conversion of a difference between a voltage of a filter input terminal and a voltage of a filter output terminal, and a first capacitor; and
   a second integrator including:
      a second transconductance circuit which performs a voltage-current conversion of a difference between an output voltage of said first integrator and the voltage of said filter output terminal,
      a third transconductance circuit, which performs a voltage-current conversion of a difference between the voltage of said filter input terminal and the voltage of said filter output terminal, wherein an output current thereof is subtracted from an output current of said second transconductance circuit, and
      a second capacitor, wherein:
   said first capacitor is connected between an output terminal of said first transconductance circuit and a ground terminal,
   said second capacitor is connected between said filter input terminal and an output terminal of said second transconductance circuit,
   the voltage of said filter input terminal is added to the output voltage of said second integrator via said second capacitor, and
   the output terminal of said second transconductance circuit is an output terminal of said filter.

3. A filter, comprising:
   a first integrator including a first transconductance circuit, which performs a voltage-current conversion of a difference between a voltage of a filter input terminal and a voltage of a filter output terminal, and a first capacitor; and
   a second integrator including:
      a second transconductance circuit which performs a voltage-current conversion of a difference between an output voltage of said first integrator and the voltage of said filter output terminal,
      a third transconductance circuit, which performs a voltage-current conversion of a difference between the voltage of said filter input terminal and the voltage of said filter output terminal, wherein an output current thereof is added to an output current of said second transconductance circuit,
      a fourth transconductance circuit, which performs a voltage-current conversion of a difference between the voltage of said filter input terminal and the voltage of said filter output terminal, wherein an output current thereof is subtracted from the output current of said second transconductance circuit, and
      a second capacitor, wherein:
   said first capacitor is connected between an output terminal of said first transconductance circuit and a ground terminal,
   said second capacitor is connected between said filter input terminal and an output terminal of said second transconductance circuit,
   the voltage of said filter input terminal is added to the output voltage of said second integrator via second capacitor, and
   the output terminal of said second transconductance circuit is an output terminal of said filter.

4. The filter according to claim 3 wherein a transconductance value of said third transconductance circuit is larger than a transconductance value of said fourth transconductance circuit.

5. The filter according to claim 3 wherein the transconductance value of said third transconductance circuit is smaller than the transconductance value of said fourth transconductance circuit.

6. A notch filter, comprising:
   a first integrator including a first transconductance circuit, which performs a voltage-current conversion of a difference between a voltage of a filter input terminal and a voltage of a filter output terminal, and a first capacitor; and
   a second integrator including:
      a second transconductance circuit which performs a voltage-current conversion of a difference between an output voltage of said first integrator and the voltage of said filter output terminal,
      a third transconductance circuit which performs a voltage-current conversion of a difference between the voltage of said filter input terminal and the voltage of said filter output terminal, wherein an output current thereof is added to an output current of said second transconductance circuit, and
      a second capacitor, wherein:
   said first capacitor is connected between an output terminal of said first transconductance circuit and a ground terminal,
   said second capacitor is connected between said filter input terminal and an output terminal of said second transconductance circuit,
   the voltage of said filter input terminal is added to the output voltage of said second integrator via said second capacitor, and
   the output terminal of said second transconductance circuit is an output terminal of said filter.

7. A notch filter, comprising:
   a first integrator including a first transconductance circuit, which performs a voltage-current conversion of a difference between a voltage of a filter input terminal and a voltage of a filter output terminal, and a first capacitor; and
   a second integrator including:
      a second transconductance circuit which performs a voltage-current conversion of a difference between an output voltage of said first integrator and the voltage of said filter output terminal,
      a third transconductance circuit, which performs a voltage-current conversion of a difference between the voltage of said filter input terminal and the voltage of said filter output terminal, wherein an output current thereof is subtracted from an output current of said second transconductance circuit, and
      a second capacitor, wherein:
   said first capacitor is connected between an output terminal of said first transconductance circuit and a ground terminal,
   said second capacitor is connected between said filter input terminal and an output terminal of said second transconductance circuit,
   the voltage of said filter input terminal is added to the output voltage of said second integrator via said second capacitor, and
   the output terminal of said second transconductance circuit is an output terminal of said filter.

8. A notch filter, comprising:
   a first integrator including a first transconductance circuit, which performs a voltage-current conversion of a difference between a voltage of a filter input terminal and a voltage of a filter output terminal, and a first capacitor; and a second integrator including:
a second transconductance circuit which performs a voltage-current conversion of a difference between an output voltage of said first integrator and the voltage of said filter output terminal,
a third transconductance circuit, which performs a voltage-current conversion of a difference between the voltage of said filter input terminal and the voltage of said filter output terminal, wherein an output current thereof is added to an output current of said second transconductance circuit,
a fourth transconductance circuit, which performs a voltage-current conversion of a difference between the voltage of said filter input terminal and the voltage of said filter output terminal, wherein an output current thereof is subtracted from the output current of said second transconductance circuit, and
a second capacitor, wherein:

said first capacitor is connected between an output terminal of said first transconductance circuit and a ground terminal, said second capacitor is connected between said filter input terminal and an output terminal of said transconductance circuit, the voltage of said filter input terminal is added to the output voltage of said second integrator via said second capacitor, and the output terminal of said second transconductance circuit is an output terminal of said filter.

9. An all-pass filter, comprising:

a first integrator including a first transconductance circuit, which performs a voltage-current conversion of a difference between a voltage of a filter input terminal and a voltage of a filter output terminal, and a first capacitor; and a second integrator including:
a second transconductance circuit which performs a voltage-current conversion of a difference between an output voltage of said first integrator and the voltage of said filter output terminal,
a third transconductance circuit which performs a voltage-current conversion of a difference between the voltage of said filter input terminal and the voltage of said filter output terminal, wherein an output current thereof is subtracted from an output current of said second transconductance circuit,
and a second capacitor, wherein:

said first capacitor is connected between an output terminal of said first transconductance circuit and a ground terminal, said second capacitor is connected between said filter input terminal and an output terminal of said second transconductance circuit, the voltage of said filter input terminal is added to the output voltage of said second integrator via said second capacitor, and the output terminal of said second transconductance circuit is an output terminal of said filter.

10. An all-pass filter, comprising:

a first integrator including a first transconductance circuit, which performs a voltage-current conversion of a difference between a voltage of a filter input terminal and a voltage of a filter output terminal, and a first capacitor; and a second integrator including:
a second transconductance circuit which performs a voltage-current conversion of a difference between an output voltage of said first integrator and the voltage of said filter output terminal,
a third transconductance circuit, which performs a voltage-current conversion of a difference between the voltage of said filter input terminal and the voltage of said filter output terminal, wherein an output current thereof is added to an output current of said second transconductance circuit, and
a fourth transconductance circuit, which performs a voltage-current conversion of a difference between the voltage of said filter input terminal and the voltage of said filter output terminal, wherein an output current thereof is subtracted from the output current of said second transconductance circuit, and
a second capacitor, wherein:

said first capacitor is connected between an output terminal of said first transconductance circuit and a ground terminal, said second capacitor is connected between said filter input terminal and an output terminal of said second transconductance circuit, the voltage of said filter input terminal is added to the output voltage of said second integrator via said second capacitor, and the output terminal of said second transconductance circuit is an output terminal of said filter.

11. A filter, comprising:

(a) a first integrator including:
a first full differential transconductance circuit which performs a voltage-current conversion of a difference between a voltage of a positive phase filter input terminal and a voltage of a negative phase filter input terminal,
a second full differential transconductance circuit which performs a voltage-current conversion of a difference between a voltage of a positive phase filter output terminal and a voltage of a negative phase filter output terminal, and
a first capacitor; and (b) a second integrator including:
a third full differential transconductance circuit which performs a voltage-current conversion between a difference of a voltage of a positive polarity output terminal and a voltage of a negative polarity output terminal of said first integrator,
a fourth full differential transconductance circuit, which performs a voltage-current conversion of a difference between the voltage of said positive phase filter input terminal and the voltage of said positive phase filter output terminal, wherein an output current thereof is added to an output current of said third full differential transconductance circuit,
a fifth full differential transconductance circuit which performs a voltage-current conversion of a difference between the voltage of said negative phase filter input terminal and the voltage of said negative phase filter output terminal wherein an output current thereof is added to the output current of said third full differential transconductance circuit,
a sixth full differential transconductance circuit which performs a voltage-current conversion of a difference between the voltage of said positive phase filter output terminal and the voltage of said negative phase filter output terminal, and a pair of second capacitors, wherein:

said first capacitor is connected between a positive polarity output terminal and a negative polarity output terminal of said second full differential transconductance circuit, a first of said pair of second capacitors is connected between a negative polarity output terminal of said third full differential transconductance circuit and said positive phase filter input terminal.

a second of said pair of second capacitors is connected between a positive polarity output terminal of said third full differential transconductance circuit and said negative phase filter input terminal, the voltage of said positive phase filter input terminal is added to the output voltage of a negative polarity output terminal of said second integrator via one of said air of second capacitors and the voltage of said negative phase filter input terminal is added to the output voltage of a positive polarity output terminal of said second integrator via the other of said pair of second capacitors, and the negative polarity output terminal and the positive polarity output terminal of said third full differential transconductance circuit become said positive phase filter output terminal and said negative phase filter output terminal, respectively.

12. A filter, comprising:

(a) a first integrator including:

a first full differential transconductance circuit which performs a voltage-current conversion of a difference between a voltage of a positive phase filter input terminal and a voltage of a negative phase filter input terminal, a second full differential transconductance circuit which performs a voltage-current conversion of a difference between a voltage of a positive phase filter output terminal and a voltage of a negative phase filter output terminal, and a first capacitor; and (b) a second integrator including:

a third full differential transconductance circuit which performs a voltage-current conversion between a difference of a voltage of a positive polarity output terminal and a voltage of a negative polarity output terminal of said first integrator, a fourth full differential transconductance circuit, which performs a voltage-current conversion of a difference between the voltage of said positive phase filter input terminal and the voltage of said negative phase filter input terminal, wherein an output current thereof is added to an output current of said third full differential transconductance circuit with positive polarity, a fifth full differential transconductance circuit, which performs a voltage-current conversion of a difference between the voltage of said positive phase filter input terminal and the voltage of said negative phase filter input terminal, wherein an output current thereof is added to the output current of said third full differential transconductance circuit with reversed polarity, a sixth full differential transconductance circuit, which performs a voltage-current conversion of a difference between the voltage of said positive phase filter output terminal and the voltage of said negative phase filter output terminal, wherein an output current thereof is added to the output current of said third full differential transconductance circuit with positive polarity, a seventh full differential transconductance circuit, which performs a voltage-current conversion of a difference between the voltage of said positive phase filter output terminal and the voltage of said negative phase filter output terminal, wherein an output current thereof is added to the output current of said third full differential transconductance circuit with reversed polarity, an eighth full differential transconductance circuit which performs a voltage-current conversion of a difference between the voltage of said positive phase filter output terminal and the voltage of said negative phase filter output terminal, and a pair of second capacitors, wherein:

said first capacitor is connected between a positive polarity output terminal and a negative polarity output terminal of said second full differential transconductance circuit, a first of said pair of second capacitors is connected between a negative polarity output terminal of said third full differential transconductance circuit and said positive phase filter input terminal.

a second of said pair of second capacitors is connected between a positive polarity output terminal of said third full differential transconductance circuit and said negative phase filter input terminal.

the voltage of said positive phase filter input terminal is added to the output voltage of a negative polarity output terminal of said second integrator via one of said air of second capacitors and the voltage of said negative phase filter input terminal is added to the output voltage of a positive polarity output terminal of said second integrator via the other of said pair of second capacitors, and the negative polarity output terminal and the positive polarity output terminal of said third full differential transconductance circuit become said positive phase filter output terminal and said negative phase filter output terminal, respectively.

* * * * *